(12) United States Patent  
Catalano et al.

(10) Patent No.: US 7,946,730 B2
(45) Date of Patent: *May 24, 2011

(54) LIGHT EMITTING DIODE REPLACEMENT LAMP

(75) Inventors: Anthony Catalano, Boulder, CO (US); Daniel Harrison, Nederland, CO (US)

(73) Assignee: TerraLUX, Inc., Longmont, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/546,377

(22) Filed: Aug. 24, 2009

(65) Prior Publication Data

US 2009/0309501 A1   Dec. 17, 2009

Related U.S. Application Data

(60) Continuation of application No. 11/868,406, filed on Oct. 5, 2007, now Pat. No. 7,597,456, which is a division of application No. 10/893,727, filed on Jul. 16, 2004, now Pat. No. 7,296,913.

(60) Provisional application No. 60/517,130, filed on Nov. 4, 2003.

(51) Int. Cl.
*F21V 21/00* (2006.01)

(52) U.S. Cl. .......... 362/257; 362/246; 362/249.11; 362/800

(58) Field of Classification Search .......... 362/240, 362/249.02, 249.11, 257, 545, 800; 315/185, 315/246, 307

See application file for complete search history.

(56) References Cited

U.S. PATENT DOCUMENTS

| 3,795,830 | A | 3/1974 | Richardson |
| 4,211,955 | A | 7/1980 | Ray |
| 4,727,289 | A | 2/1988 | Uchida |
| 5,463,280 | A | 10/1995 | Johnson |
| 5,561,346 | A | 10/1996 | Byrne |
| 5,575,459 | A | 11/1996 | Anderson |
| 5,655,830 | A | 8/1997 | Ruskouski |
| 5,663,719 | A | 9/1997 | Deese et al. |
| 5,850,126 | A | 12/1998 | Kanbar |
| 5,936,599 | A | 8/1999 | Reymond |
| 5,994,845 | A | 11/1999 | Gibboney, Jr. |
| 6,091,614 | A | 7/2000 | Malenfant |
| 6,150,771 | A | 11/2000 | Perry |
| 6,310,445 | B1 | 10/2001 | Kashaninejad |
| 6,371,636 | B1 | 4/2002 | Wesson |
| 6,528,954 | B1 | 3/2003 | Lys et al. |
| 6,570,505 | B1 | 5/2003 | Malenfant |
| 6,853,151 | B2 | 2/2005 | Leong et al. |
| 7,296,913 | B2 * | 11/2007 | Catalano et al. ............ 362/257 |

* cited by examiner

*Primary Examiner* — John A Ward
(74) *Attorney, Agent, or Firm* — Bingham McCutchen LLP (57) ABSTRACT

The invention is a replacement for a conventional incandescent or halogen light bulb. Besides providing regular illumination, it has advantages over a conventional bulb while maintaining the bulb's decorative function, such as visual effects associated with the bulb's envelope or shade. The invention comprises a connector equivalent to a standard light bulb base, at least one light emitting diode (LED), and a driving circuit hosted on a module such as a printed circuit board and adapting the supply voltage to the requirements of the LED. Compensation for the effects of temperature may be included. The invention may also include other circuitry to support various enhanced features such as novel decorative features or control over the brightness, color, or other characteristics—all potentially varying over time or being controlled remotely.

49 Claims, 9 Drawing Sheets

LIGHT EMITTING DIODE REPLACEMENT LAMP

CROSS-REFERENCE TO RELATED APPLICATIONS

This application is a continuation application of U.S. patent application Ser. No. 11/868,406 filed Oct. 5, 2007 now U.S. Pat. No. 7,597,456; which is a divisional application of U.S. patent application Ser. No. 10/893,727 filed Jul. 16, 2004 and now issued as U.S. Pat. No. 7,296,913 on Nov. 20, 2007; which claims priority under 35 USC 119(e) from U.S. Provisional Patent Application No. 60/517,130 filed Nov. 4, 2003; the disclosures of which are incorporated herein by reference.

BACKGROUND

1. Field of the Invention

The present invention relates to a light emitting diode (LED) illumination device and method and more specifically to a light emitting diode, integrated with electronic circuitry that enables both an illumination function as well as a decorative function that can be varied by the user.

2. Description of Related Art

Currently lighting applications are dominated by incandescent lighting products. Because they use hot filaments, these products produce considerable heat, which is wasted, in addition to visible light that is desired. Halogen based lighting enables filaments to operate at a higher temperature without premature failure, but again considerable non-visible infrared light is emitted that must be disposed of. This is conventionally done by using a dichroic reflector shade that preferentially passes the infrared as well as a portion of the visible light. The nature of this dichroic reflector is such that it passes several different visible colors as well as the infrared radiation, giving a somewhat pleasing appearance. This has lead to numerous applications for the halogen lights in which the entire light is used for decorative purposes. These lights consume substantial current and dissipate considerable unwanted heat. These bulbs are designed to operate at a variety of voltages between 12 Volts to as high 115 Volts or greater.

Light emitting diodes have operating advantages compared to ordinary incandescent as well as halogen lights. LEDs can emit in a narrow range of wavelengths so that their entire radiant energy is comprised within a predetermined range of wavelengths, eliminating, to a large degree, wasted energy. By combining light colors white can be created. Because such LEDs can now emit in the ultraviolet, the emitted radiation can also be used to excite a phosphor to create white light and other hues.

LEDs have an extremely long life compared to incandescent and halogen bulbs. Whereas incandescent and halogen bulbs may have a life expectancy of 2000 hours before the filament fails, LEDs may last as long as 100,000 hours, and 5,000 hours is fairly typical. Moreover, unlike incandescent and halogen bulbs, LEDs are not shock-sensitive and can withstand large forces without failure, while the hot filament of an incandescent or halogen bulb is prone to rupture.

Halogen bulbs, incandescent bulbs, and LEDs all require a fixed operating voltage and current for optimal performance. Too high an operating voltage causes premature failure, while too low an operating voltage or current reduces light output. Also, the color of incandescent and halogen lights shifts toward the red end of the visible spectrum as current and voltage are reduced. This is in contrast to LEDs, in which only the intensity of the light is reduced. Furthermore, as the voltage to an incandescent and halogen light is reduced, its temperature drops, and so its internal resistance decreases, leading to higher current consumption, but without commensurate light output. In cases where batteries are used as the source of energy, they can be drained without producing visible light.

Incandescent and halogen bulbs require a substantial volume of space to contain the vacuum required to prevent air from destroying the filament and to keep the glass or silica envelope from overheating and to insulate nearby objects from the damaging heat. In contrast, LEDs, being solid state devices, require much less space and generate much less heat. If the volume of an incandescent or halogen bulb is allocated to a solid state LED light, considerably more functions can be incorporated into the lighting product.

Unlike incandescent and halogen lights, LEDs ordinarily produce light in a narrow, well defined beam. While this is desirable for many applications, the broad area illumination afforded by incandescent and halogen lights is also often preferred. This is not easily accomplished using LEDs. The light produced by incandescent and halogen lights that is not directed towards the target performs a useful function by providing ancillary illumination and a decorative function. Halogen lights with their dichroic reflectors do this unintentionally, but ordinary incandescent lights employ external shades, not part of the light bulb, in a variety of artistic designs to make use of this otherwise misdirected light.

SUMMARY OF THE INVENTION

The present invention overcomes the limitations of halogen or incandescent light sources, and combines their desirable properties with the advantages afforded by LEDs into a unique system and product intended for general illumination purposes.

An embodiment of the present invention may therefore comprise an LED lamp that is capable of replacing standard incandescent and halogen bulbs for a wide variety of purposes. The functionality of this lighting system will go well beyond what is available in ordinary incandescent and halogen lights. Note that standard bulbs frequently are used in fixtures which provide two functions: direct lighting and decorative lighting. The decorative lighting in particular is often associated with a shade, which may alter various properties of some or all the illumination, some of which may be superfluous to the direct illumination function.

This embodiment will contain an electrical connector or base the same as or equivalent to the standard bulb base, a printed circuit board (or other circuit substrate or module) electrically connected to the base, a driving circuit that is mounted on or embodied by the printed circuit board, and one or more LEDs of one or more colors attached to the printed circuit board. The driving circuit comprises a solid state circuit that regulates the voltage and current available from the source and regulates the output to the constant value required for the LEDs. The available source voltage be either above or below that required by the LEDs.

An additional embodiment to the present invention may also comprise an LED lamp that replaces incandescent and halogen lamps as well as their decorative shades by including LEDs on both sides of the printed circuit (PC) board, where the LEDs are on the opposite side of that intended for direct illumination and where they provide the decorative function. These LEDs may provide a decorative function by illuminating the built-in envelope or shade around the lamp.

An additional embodiment to the present invention may include additional circuitry occupying the volume available. This circuitry may include the following: circuitry to allow remote control of lighting functions via an infrared or wireless device; circuitry to change the color of either or both of the (decorative) shade illumination and the direct illumination LEDs; circuitry that causes a time variant color and or intensity to the (decorative) shade illumination and/or the direct illumination; circuitry that allows the external switching via mechanical action of color, pattern or intensity on either the shade or direct illumination; circuitry that enables the switching of the various functions of color, intensity, pattern by interrupting the power to the circuit within a predetermined time interval.

An additional embodiment to the present invention may include mechanical actuators that alter the pattern and color of light to the shade for the purpose of decorative illumination. This may include a mechanical method such as a shadow screen, multi-faceted mirror or other reflective or diffractive optical component or components either fixed within the envelope of the lighting unit, or provided with a means of moving the internal components to vary the pattern and or color of the resulting light for decorative or functional purposes.

An additional embodiment of the present invention may comprise the method or methods for accomplishing the above-mentioned attributes.

DETAILED DESCRIPTION OF THE INVENTION

While this invention is susceptible to embodiment in many different forms, there are shown in the drawings, and will be described herein in detail, specific embodiments thereof with the understanding that the present disclosure is to be considered as an exemplification of the principles of the invention and is not to be limited to the specific embodiments described.

Figure 1:
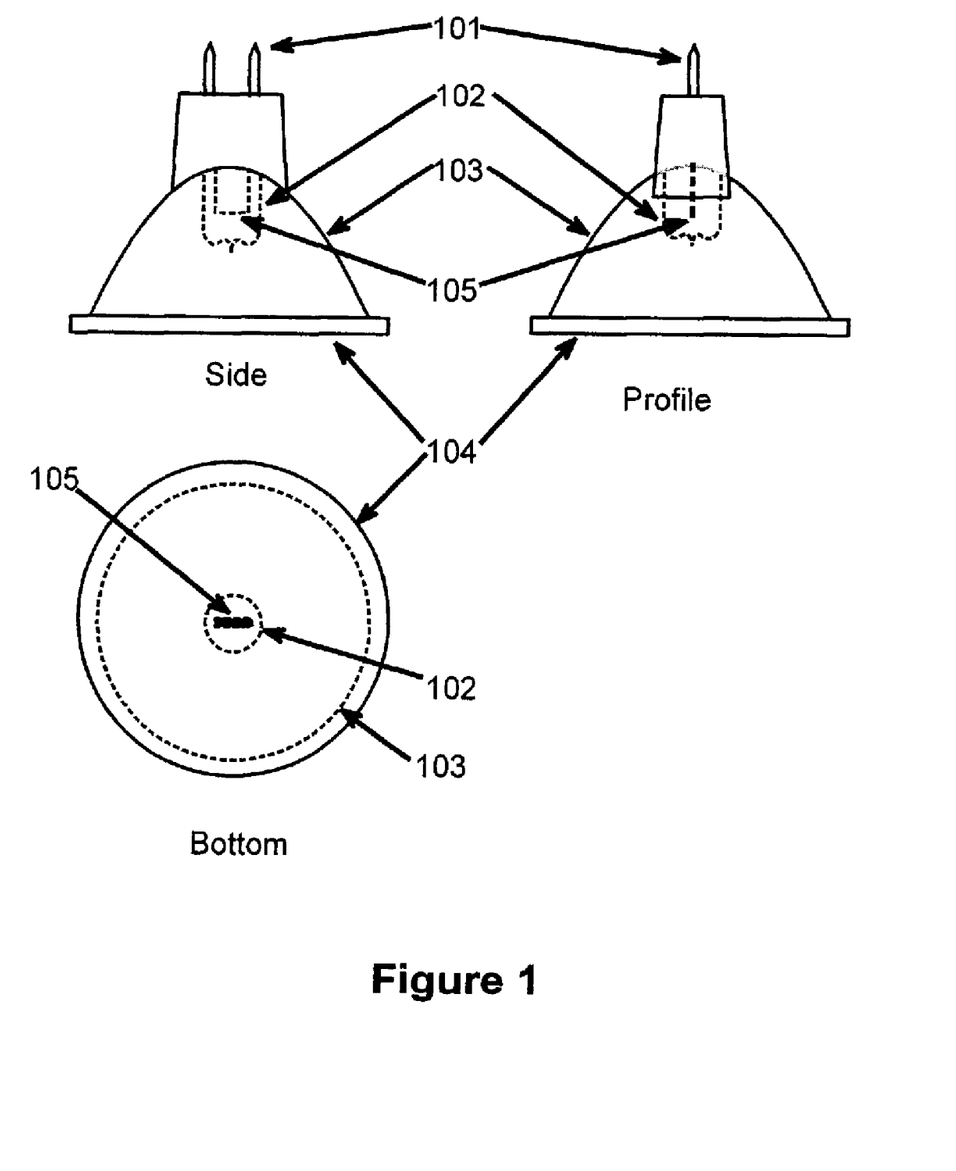
FIG. 1 illustrates an example of the current state-of-the-art halogen illumination device referred to commonly as an MR-16.

FIG. 1 illustrates an incandescent halogen type bulb commonly available. The features of this bulb have been derived from the operating characteristics implicit in the operation of these type illumination devices: they operate at high temperatures; they require an evacuated envelope separated from the hot filament; they emit large quantities of infrared radiation experienced by the user as heat; and they consume large quantities of electrical power. Nonetheless these devices are in common usage and fixtures and appliances have been constructed to accommodate the form, fit, and function of these bulbs. This particular unit is a model MR-16.

FIG. 1 illustrates the incandescent halogen bulb and its essential components. These are a connector 101 that attaches to a standard source of electrical power which has a mating adapter; an evacuated transparent capsule 102 containing the hot filament 105; an envelope 103 that acts as a shade and filter to allow infrared radiation to pass, while reflecting a portion of the desirable visible light to the objects below; a transparent front cover 104 that allows the radiation to pass, while protecting the evacuated capsule 102 from breakage.

In contrast to incandescent lights, LEDs consume less power, emit in a narrow beam, emit less heat, and can be formulated in a wide variety of colors both inside and outside the spectrum visible to humans. Because of these implicit differences, the use of LEDs creates opportunities to add operation features to light bulbs, which heretofore were considered simple illumination devices. It is the object of this disclosure to enumerate unique features that will improve the usefulness of the lighting devices based on LEDs.

Figure 2:
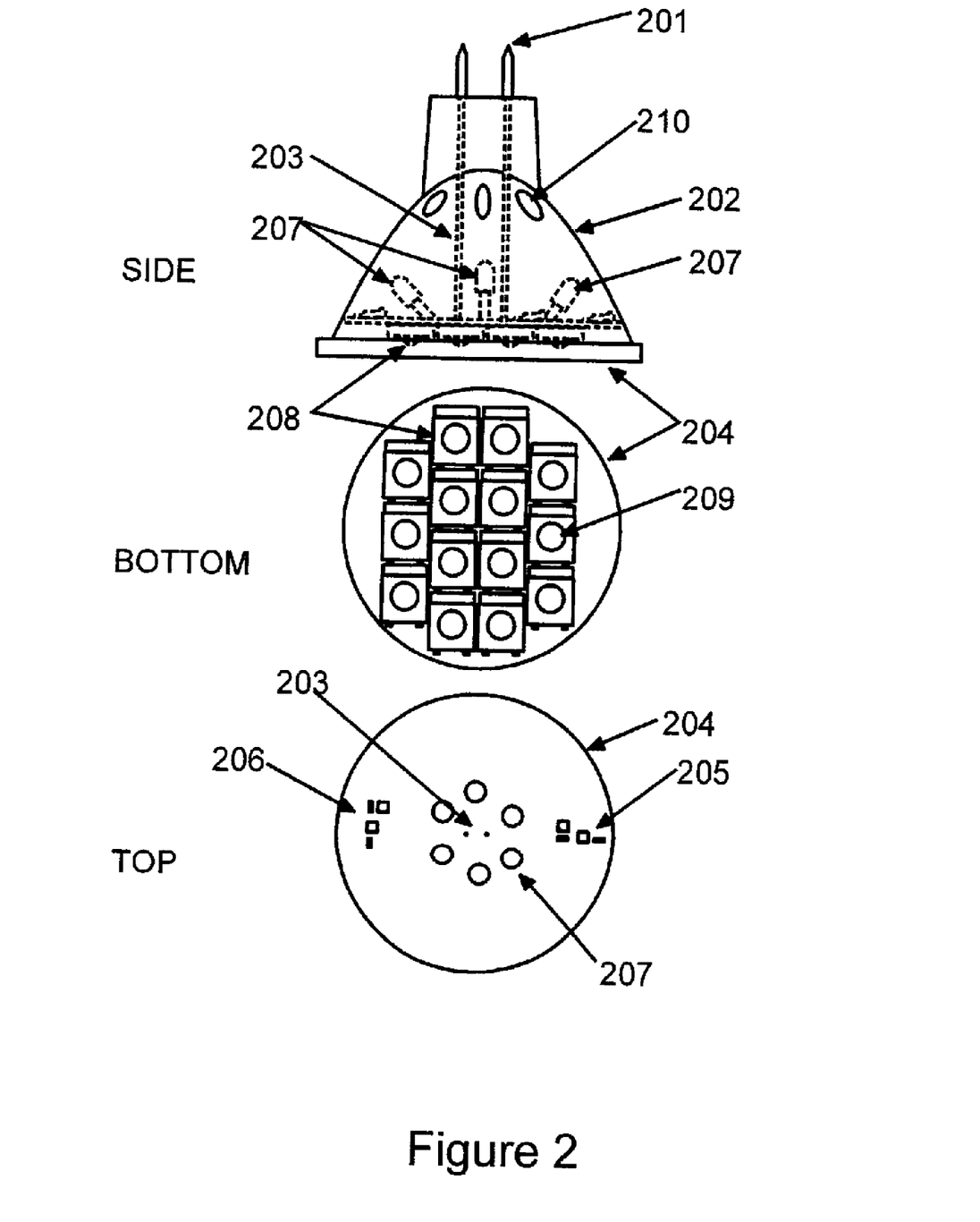
FIG. 2 illustrates an embodiment of the present invention that can retrofit the halogen illumination device and contains LEDs for illumination on one side and LEDs for direct illumination on the other. Circuitry to enable regulation and other features is also shown.

FIG. 2 illustrates the first embodiment of the current invention. This illuminating device is intended to have the same form fit and function as the incandescent illumination device of FIG. 1 and as such has a similar electrical connector 201 and similarly shaped transparent or translucent envelope 202. The envelope 202 will act to scatter light emitted from inside the envelope and be visible from the outside. As such, the envelope 202 can serve as a screen onto which are projected and displayed images, colors or other decorative or information-containing light either visible to humans or at shorter or longer wavelengths. The content of this information is formulated by circuitry contained on one or more circuit boards 206 contained within the envelope of the bulb 202. This circuit 206 in its simplest form controls other illumination devices such as the LEDs 207 also located on the back of the circuit board 204. Another circuit 205 can be used to control high power LEDs 209 in an array 208 located on the opposite side for direct illumination of objects outside the envelope of the lighting device. However, this circuit or circuits may enable several useful features. These are:

1. A timer to adjust the color and illumination level according to some preset or user-adjustable schedule.
2. A photocell to turn on or off the light depending on the ambient light level and or a proximity sensor.
3. A signaling function that communicates with other lights
4. A switch that is user accessible that allows a switching of illumination characteristics such intensity, color, continuous or flashing illumination modes.

Also located on circuit board 204 is a power conditioning circuit 205 that regulates power to the high intensity LEDs 208 located on the underside of the board. This circuit adapts and controls the power available via the connector 201 and conducted to the board via wires 203. The circuit 205 may contain storage features including a battery to enable the lighting device to act as an emergency light source in the event of a power failure. The circuit may rectify ac power to dc to suit the desired current and voltage required by the series and/or parallel array of LEDs and provide power to other on-board circuitry.

In this embodiment, the LEDs 207 on the backside of the PC board 204 can serve the function of communication and or decoration. For decorative purposes, the shade 202 will be made of a colored or white transparent or preferably translucent material such as plastic or glass which is textured so as to scatter light. In this manner light from the LEDs 207 impinge on this surface and are made more visible to the user, and can serve the function of decoration. The shade 202 may also contain penetrations 210 to allow heat to exit the LED enclosure.

Figure 3:
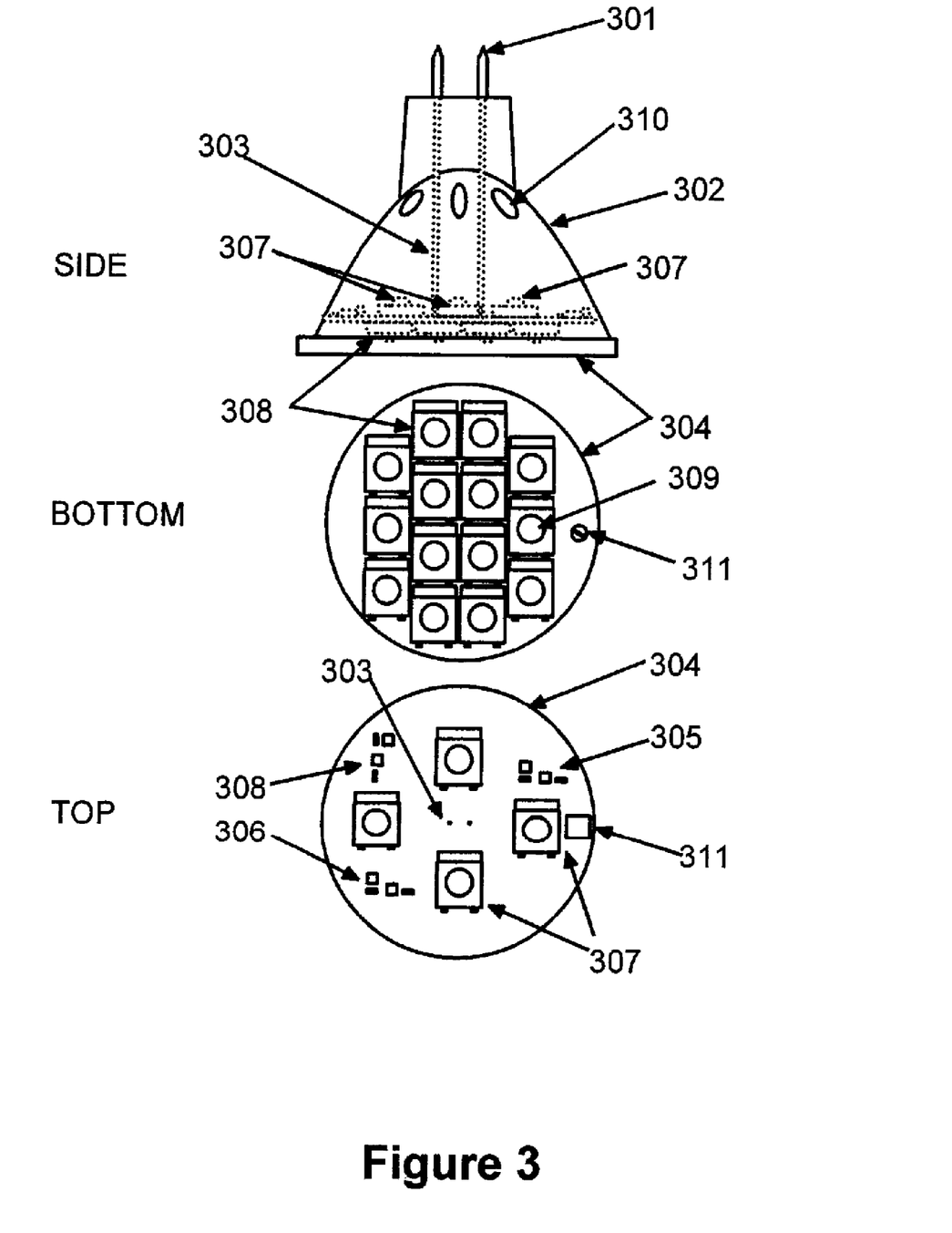
FIG. 3 illustrates an embodiment of the present invention in which high intensity LEDs are placed on both sides to produce shade illumination and direct illumination. A switch and circuitry for changing the attributes of the lighting is also shown.

FIG. 3 illustrates a similar incandescent replacement product. This product also contains an electrical connector 301, a shaped translucent or transparent envelope 302 with holes 310 to remove heat, one or more printed circuit boards 304 within the enclosure, means such as wires 303 to conduct electrical power to these board(s). The product now has high intensity illumination LEDs 307 on the top surface and other high intensity LEDs 309 in an array 308 on the bottom surface. Unlike the product of FIG. 2 which had small LEDs with a narrow exit beam and low intensity, these high intensity LEDs 309 and 307 have a higher light output generally greater than 10 lumens and the exit angle of the light may range from a narrow angle to a very broad beam as desired. To control these LEDs additional circuitry may be required as shown in the figure. In addition to the power transforming circuit 305, and the control circuits 306, additional power handling circuits 311 may be necessary. These high power LEDs may have one or more colored light outputs other than white, and have different orientations other than vertical to provide decorative illumination above the lighting product. A switch 311 that is accessible by the user can be used to control characteristics of operation of the lighting product.

Figure 4:
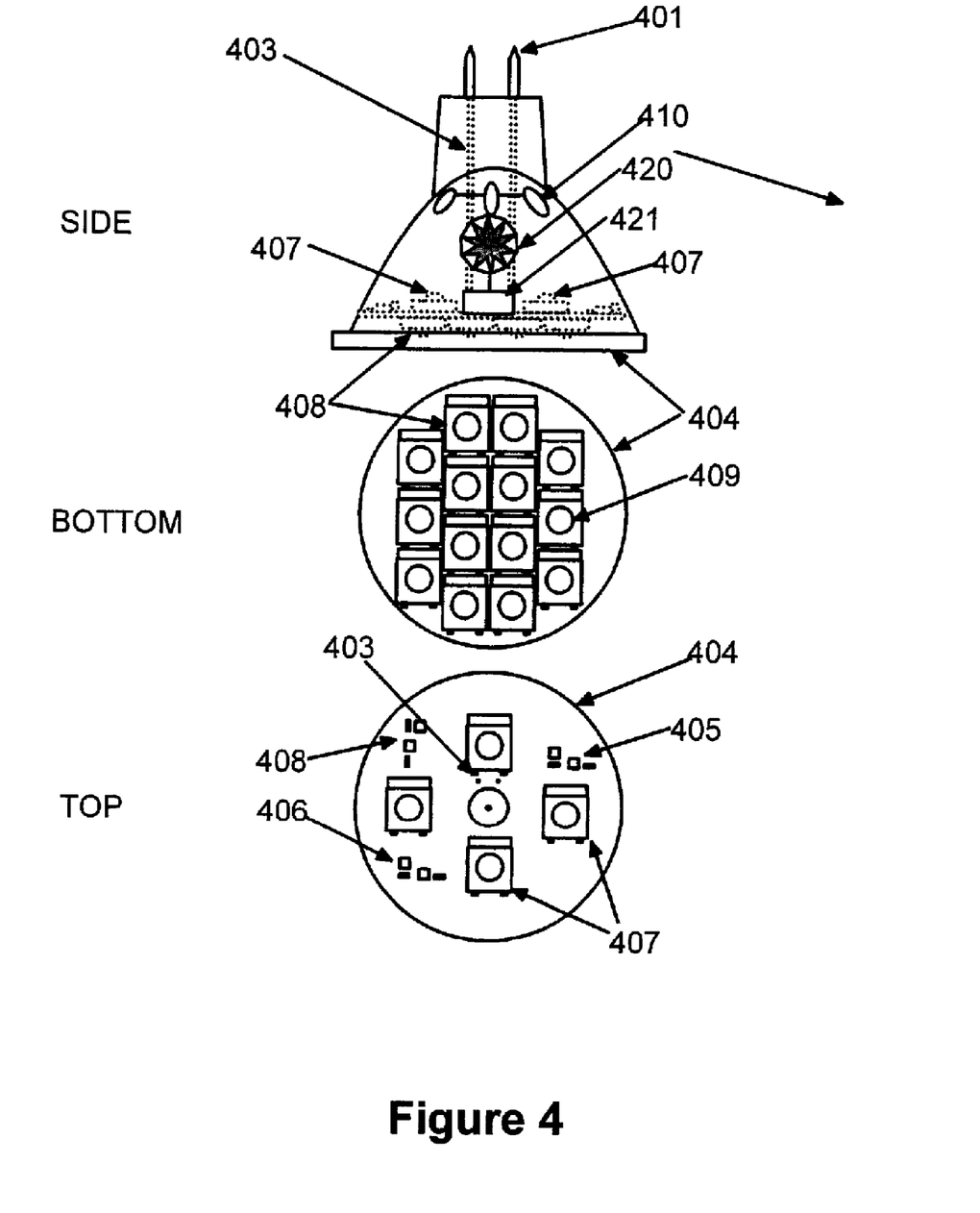
FIG. 4 illustrates another embodiment of the present invention in which a movable, multifaceted mirror is included on the shade side of the illumination unit to provide a variable pattern on the shade.

FIG. 4 illustrates another embodiment of the product. Unlike the previous examples in which modification of the color, intensity and pattern took place by electrically controlling the electrical power to individual devices of one or more orientations and color, this product contains a mechanical method for varying the intensity, and pattern with time. This is accomplished for example using a multi-faceted mirror 420, operated by a miniature electric motor 421 that changes the orientation and position of the mirror. In this way light is reflected or diffracted to form a pattern of shapes and color on the translucent or transparent envelope 402.

Figure 5:
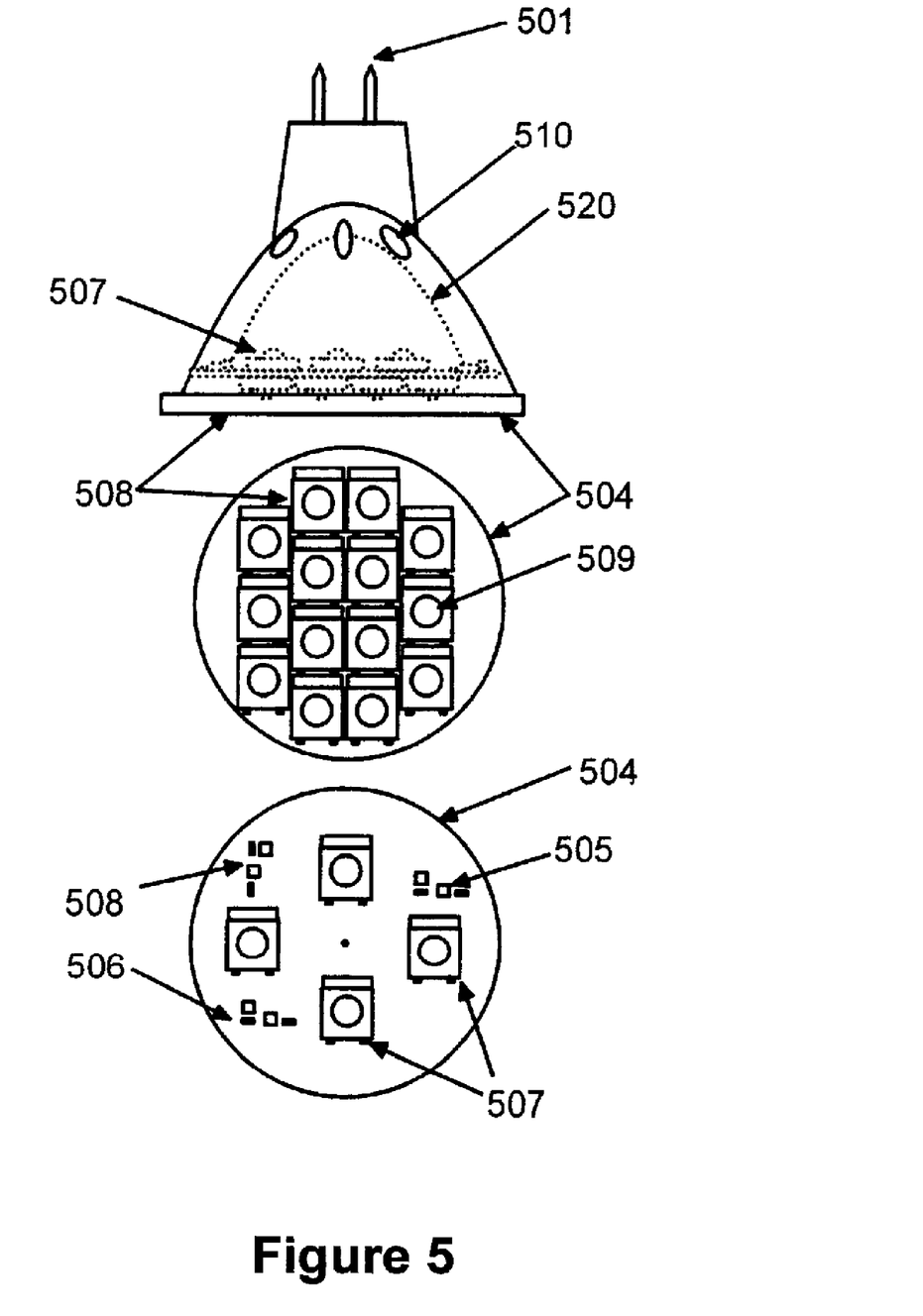
FIG. 5 illustrates another embodiment of the present invention in which an internal fixture containing apertures is included to pattern illumination to the shade.

FIG. 5 illustrates another embodiment in which is added the feature of a patterned mask 520 that casts a shadow or other optical means a predetermined pattern by blocking or otherwise modifying the pattern of light emanating from the internal LEDs 507 located on the back side of the circuit board 504. Other features from other embodiments discussed already may also be incorporated.

It may be appreciated from these descriptions that the LEDs used in these embodiments, though small, occupy considerable space that limits the overall light output of the product. This is due to the need to provide electrical connections to each of the semiconductor light emitting chips that are housed in large packages that provide both electrical connections and a means for removing heat and permit the exiting of useful light. The packages also often contain a lens or mirror for shaping and directing this light. While these packages allow some freedom of use, they also limit the density and eliminate the means to provide the integration of the functions of heat dissipation, light direction and electrical connection by independent means. Many of these functions could be accommodated within a printed circuit board of appropriate design for a group of devices at the same time and within the circuit as it is formed.

Figure 6:
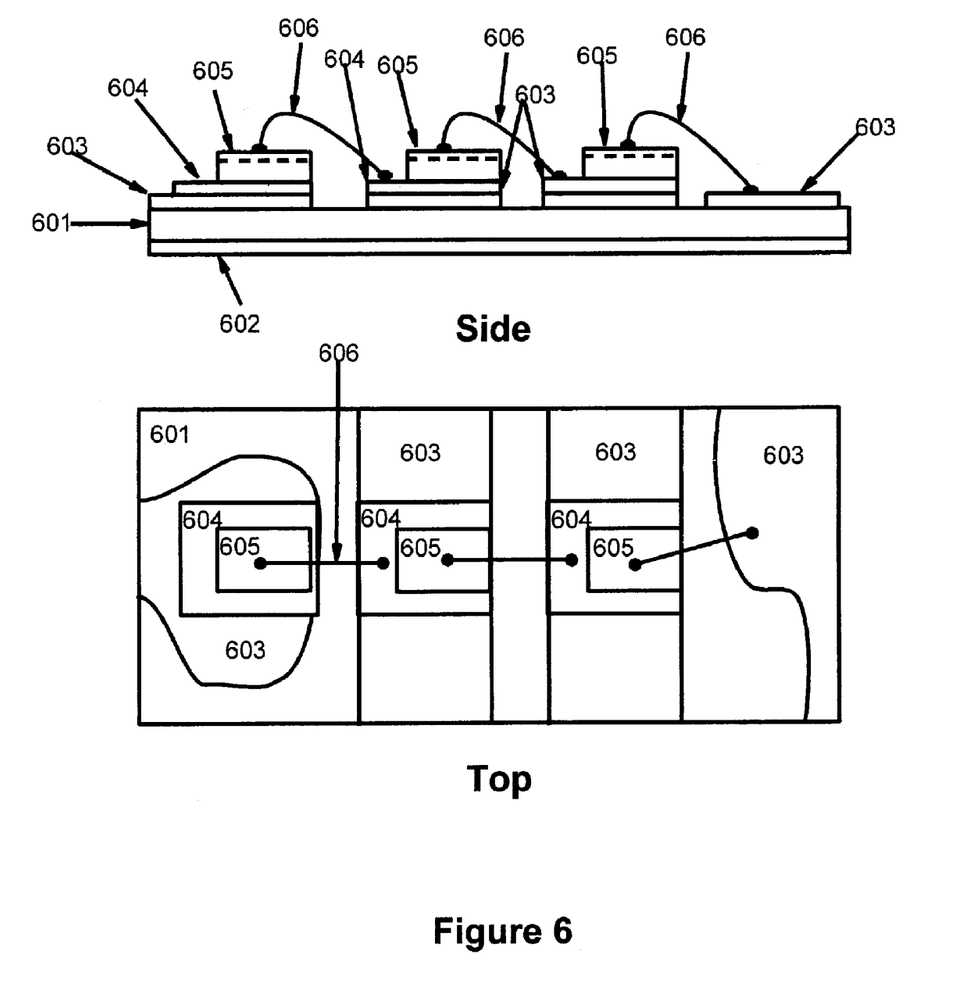
FIG. 6 illustrates a means for producing a series/parallel circuit comprised of individual LED semiconductor chips on a circuit board that results in a high density lighting array.

One means of improving the light density of the overall product is to incorporate the light emitting dies onto a suitable patterned circuit board that contains the external circuitry needed to power and connect the LED devices without the excess baggage of a package. FIG. 6 illustrates such an arrangement. The embodiment consists of a printed circuit board comprised of at least a middle portion 601 that may be the usual fiberglass core or one that contains metals, ceramics or other materials to enhance thermal conductivity, a top metal clad layer 603 and a bottom cladding layer 602. It should be well understood that these top and bottom layers can easily be patterned by such processes as etching. A light emitting assembly can be attached to the patterned surface of cladding 603 by cementing with a thermally and electrically conducting compound or by welding or some other method. Then the cladding 603 may act as either or both a thermal and electrical conducting pathway. The light emitting assembly consists of a metal base 604 to which is bonded a semiconductor light emitting chip 605. This light emitting chip contains a pn junction that emits light and conducting top and bottom surface layers for electrical and thermal contact. A conducting wire or tab connects the top conducting member of the junction to the opposite conducting pad on the next assembly, thus building up a circuit that is in series. Using a different connection scheme, but the same general method, a parallel connection can be assembled. By doing this, a relatively dense build-up of light emitting chips can be assembled using the thermal and electrical transfer characteristics of the printed circuit board. Furthermore, heat sinking, cooling or other components can be attached to the board, improving performance, for example on the back side 602 of the printed circuit board. Although not shown, it should be understood that this connection method can be extended in the two dimensions of the plane of the board.

Such chips as illustrated in FIG. 6 will emit light in all directions. Such a distribution of light may not be desired for any lighting applications. Therefore, a matching array of lens that is positioned over the light emitting chips would be desirable. This separation of the top lens array from the LEDs is desirable as it allows the lens array to be positioned independently, allowing the light directed by the lens to be moved and/or focused by moving the lens array in the three dimensions. The movement can be controlled via a variety of methods such as stepper motors or piezoelectric activated motion controllers whose support electronics is also contained on the printed circuit board. The array of lenses can be molded from a transparent clear or colored material with a variety of spherical or hemi-spherical shapes.

Figure 7:
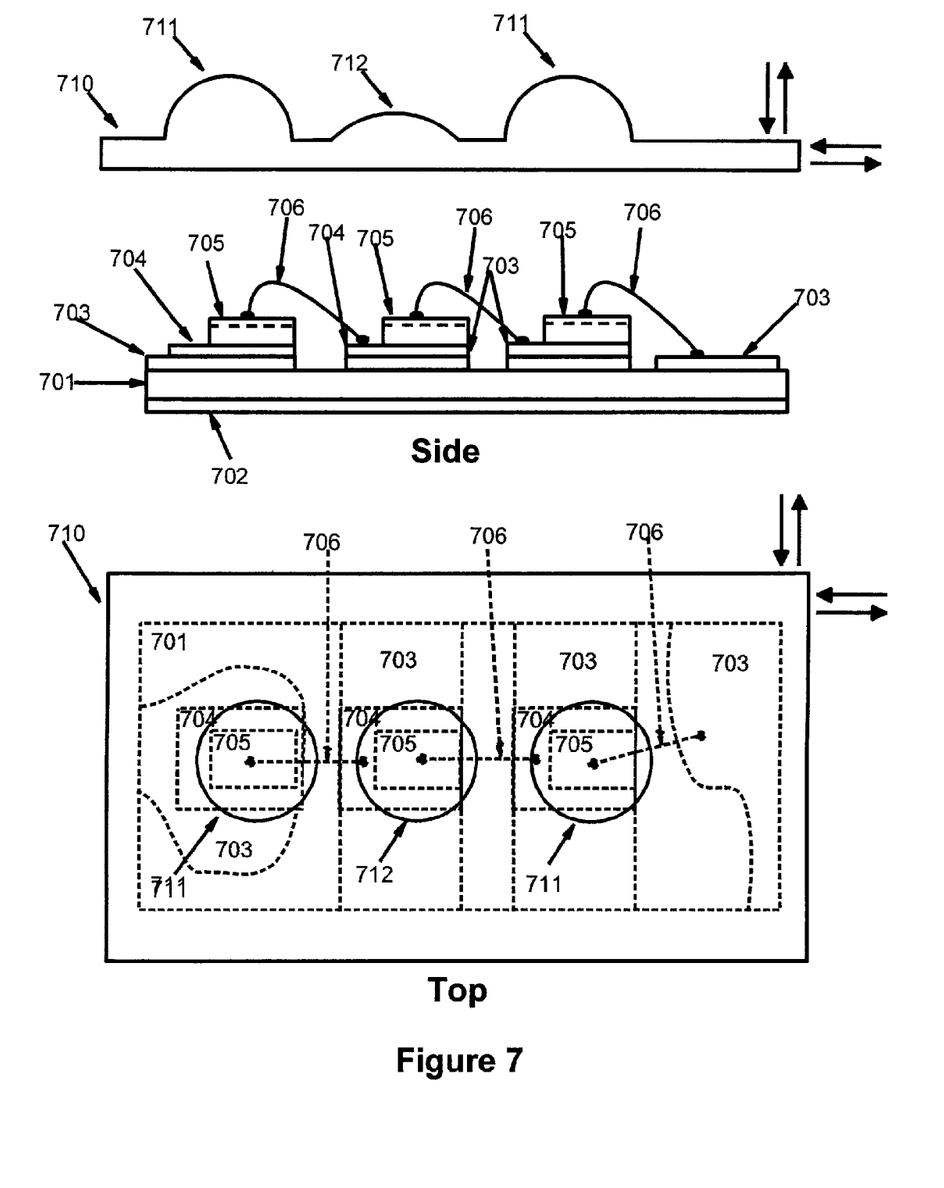
FIG. 7 shows and embodiment of the high density LED array in which it is coupled with an integrated lens array that is movable to produce variable directional lighting.

FIG. 7 illustrates such an arrangement. The PC board 701 containing patterned metal traces 703 has located on its surface light emitting portions consisting of semiconductor light emitting devices 705 that are mounted on bases 704. These areas are bonded together with electrically conducting wires or strips to form a series/parallel circuit. Positioned over the top of these light emitting regions is a lens array 710 into which have been formed by a method such molding, a matching series of optical elements. Three such elements of two different shapes labeled 711 and 712 are shown. This lens array 710 is spaced apart from the semiconductor array and mounted in such a manner that it can be externally manipulated in one or more of the three dimensions as shown by the opposing pairs of arrows. Hence, by moving the lens array, the light emitted from the matching LED array can be directed and focused as required, in essence steering the light beam.

This can be controlled by onboard electronics, and via remote control or such other means as required such as proximity sensors, timers and the like.

These lighting products require a source of alternating (ac) or direct current (dc). Although LEDs utilize direct current, it is possible to use the LEDs to rectify ac power provided the number of LEDs is chosen to match the ac voltage. It is well understood how to transform ac power to dc via a variety of well-established methods. The use of dc power as supplied by batteries however, presents some problems because as the battery voltage declines under load, the current drawn by the LEDs rapidly declines, owing to the extremely non-linear current-voltage characteristic inherent in a diode. Since the light output of a LED is directly proportional to current, this means the light output rapidly declines. On the other hand, if battery voltage exceeds a predetermined level, heating of the semiconductor junction that comprises the LED is excessive and can destroy the device. Moreover, excess heat in the LED junction causes a condition called thermal runaway, in which the heat raises the current drawn at a given voltage, leading to further heating, which in turn leads to greater current draw and quickly destroys the device. This is especially a problem with high power LEDs and requires careful thermal management.

In order to help avoid this problem it is useful to fix the current through the LEDs rather than the voltage. Using a battery as the source of current however presents a problem because of the differing voltage and current behavior of the battery power source and the LED load. Therefore, a circuit is desired to regulate and fix the current independent of the voltage supplied by the battery. In the case where the battery voltage is less than the load voltage required by the series and/or parallel LED circuit, a boost circuit can be used as pictured in FIGS. 8a and 8b. In this circuit an integrated circuit device, IC1 801 is used to control the charging and discharging of an inductor L1 803. This integrated circuit may be one of several that are available such as the Texas Instruments TPS61040. After a charging cycle, the IC switches the circuit so that the inductor L1 803 is permitted to discharge through the load, which in this case is the light emitting diodes 805. The current is controlled via a feedback resistor R1 806. The value of the resistor is chosen to fix the maximum current that is permitted to flow through the load, which in this case, is one or more LEDs (LED1, LED2) shown as 805. This manner of control occurs because the voltage drop across R1 806 is compared to an internally generated reference voltage at pin FB of IC1 801. When the two voltages are equal the current is considered fixed and will be controlled to that predetermined value. A diode D3 802 is used to ensure protection of the IC1 801 in case the battery source (not shown) is connected backwards. The diode 804 allows current flow through the LEDs 805 in only the forward, or light emitting direction. In this invention, such a circuit would be enclosed within the envelope of the bulb.

FIG. 8b differs from FIG. 8a in that it builds into the circuit an easy and inexpensive means of protecting the LEDs from excessive current flow and the runaway that results from high temperatures. In this circuit a resistor with a positive resistance rate of change with temperature, R2 807 is placed in series with a fixed resistor. Resistor R2 is physically located on the circuit board so as to be placed in the thermal pathway of heat emanating from the LEDs 805. Therefore, when the temperature of the LEDs 805 increases, the resistance of R2 807 also increases, and its resistance is added to that of R1 806. Since the voltage drop across these combined resistances appears on the feedback pin FB of IC1 801, the increased voltage is interpreted as a request for decreased current. Hence, the natural tendency of the LEDs 805 to draw more current that would ordinarily lead to the failure of the part is averted by introducing a self-limiting control function.

This circuit has the advantage of being very efficient and compact and having built into it a temperature regulation that allows the resulting system to automatically adapt to the thermal environment in which it is placed. Because of these attributes, it can, for example be put into a miniature lamp base of the kind used for flashlights (PR type flange base).

Figure 8:
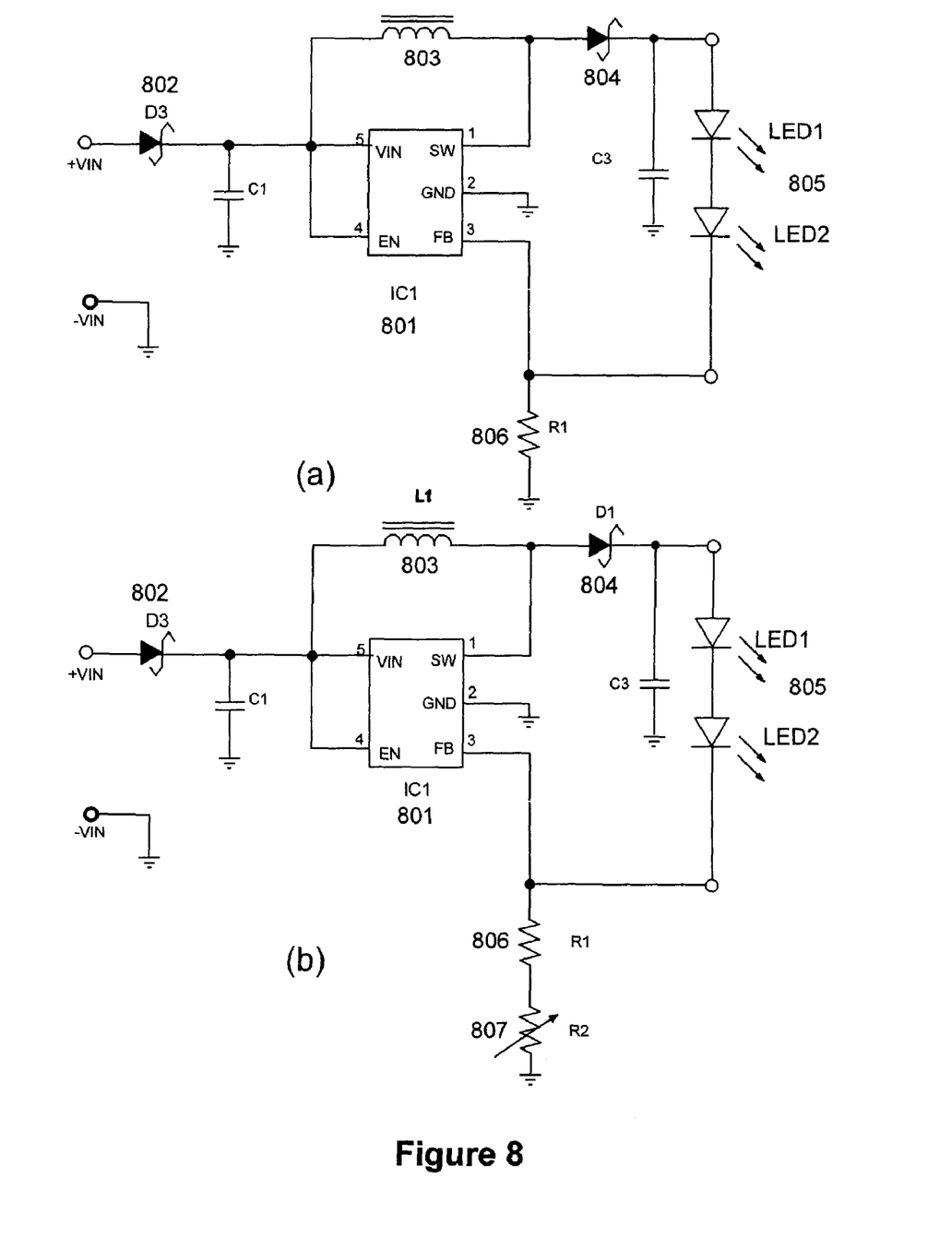
FIG. 8 is a constant current implementation of a compact dc/dc boost converter with a feature that enables current regulation of the LEDs based on the thermal environment.

However, the remaining limitation of the circuit is that it can only boost voltage from a lower value to a higher value required by the LED load. Therefore, in situations where only one LED is required, but a higher input voltage is all that is available, the excess voltage will appear across the LED even if the circuits in FIG. 8 are used. This will cause an excessive current to be drawn, leading to premature failure of the LED and premature draining of the battery. To solve this problem we require a circuit that is still compact enough to fit into a bulb or bulb base, and that is capable of either raising or lowering the output voltage above or below the voltage of the incoming battery or other dc supply in order to maintain the desired current through the LED load. Hence this circuit would either boost the voltage if the input voltage were lower than required by the LED or reduce the voltage if it were higher than that required to sustain the necessary constant current through the LED. It is understood that LED here may refer to one or more LEDs in a series, parallel or series/parallel circuit. Furthermore, because of the deleterious effects of temperature, this circuit must have the ability to regulate the current through the LED depending on the ambient temperature. The ambient temperature may be determined by the environment as well as heat dissipated by the circuit and the LED.

Figure 9:
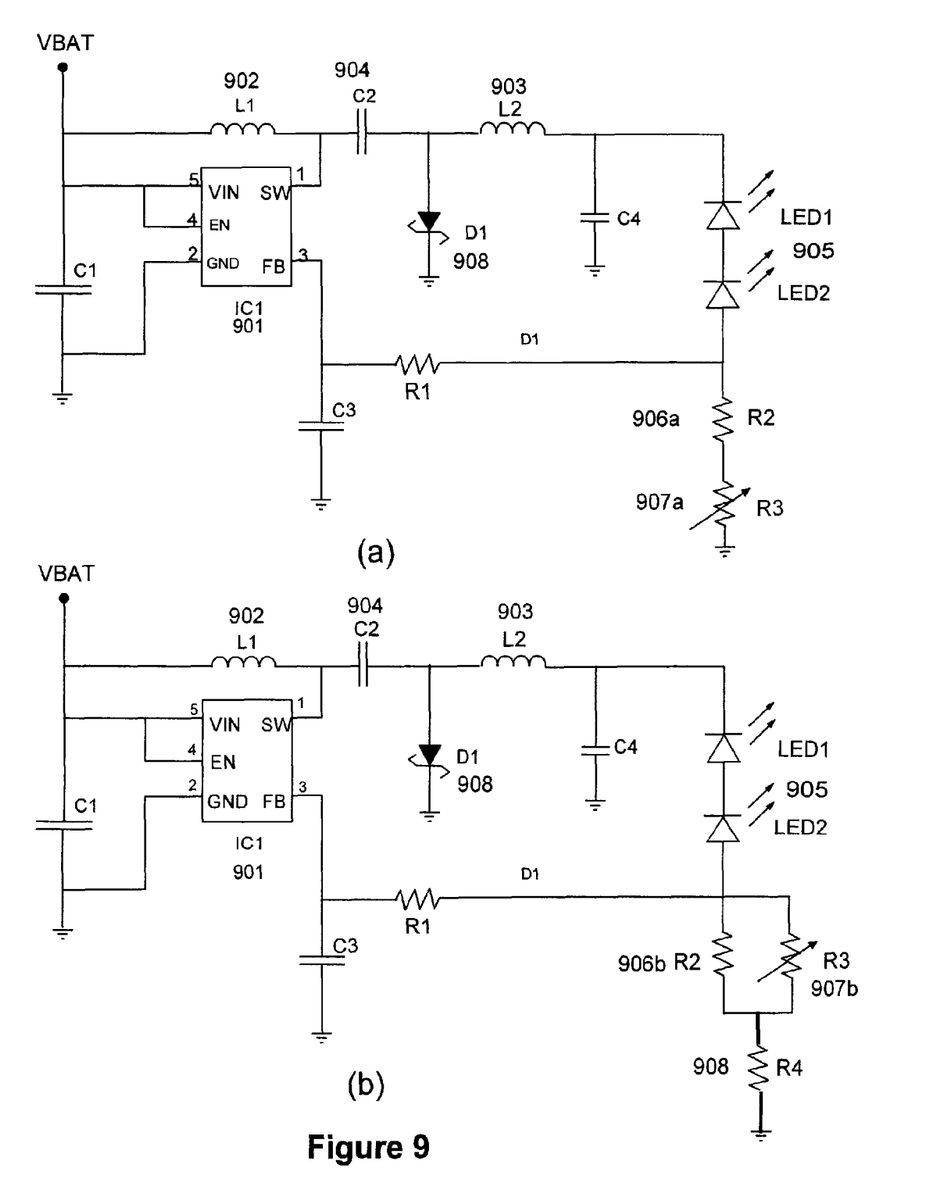
FIG. 9 is a compact constant current buck/boost circuit in which several methods that enable current regulation based on the thermal environment are illustrated.

Such a circuit is disclosed in FIG. 9. This circuit utilizes a so-called Cuk converter that is ordinarily used as an inverting switching voltage regulator. Such a device inverts the polarity of the source voltage and regulates the output voltage depending on the values of a resistor bridge. In this invention, the inverter circuit has been altered in a unique fashion so that it acts to boost the voltage output or buck the voltage input in order to maintain a constant current through the load represented by one or more LEDs 905. The circuit incorporates an integrated circuit IC1 901 such as the National Semiconductor LM2611 Cuk Converter or equivalent. In this circuit, IC1's internal transistor is closed during the first cycle charging the inductor L1 902 from the battery source indicated as Vbat. At the same time the capacitor C2 904 charges inductor L2 903, while the output current to the LEDs 905 is supplied by inductor L2 903. In the next cycle the IC1 901 changes state to permit the inductor L1 902 to charge capacitor C2 904 and L2 903 to discharge through the LEDs 905. The control of the charging power and current through the load is performed by the resistor network consisting of R2 906a and R3 907a. The overall value of these resistors together with the current passing through the LEDs 905 from ground, sets a voltage that appears on the feedback pin (FB) of IC1 901. Resistor 907a has a positive temperature coefficient so that its resistance increases with temperature.

Because of thermal effects such as heat dissipation by the LEDs, heat produced by the IC1 or other circuit components and the ambient environmental conditions, the current must also be altered to accommodate these changes. This is affected by a temperature dependent resistor R3. In FIG. 9a, resistor R3 907a has a positive temperature coefficient in which the resistance increases with temperature. The additive effect of the series circuit with R2 906a means that as temperature rises, the overall resistance of the combination does also, leading to an increase in voltage drop. This in turn causes IC1 to decrease the output current to the LEDs 905. In FIG. 9*b* the resistor network is comprised of resistors in parallel and series. In this instance, resistors R2 and R4 906*b*, 908 are fixed and resistor R3 907*b* is temperature dependent with a positive temperature coefficient. The use of a parallel arrangement allows a greater freedom of choice of temperature dependence than a simple series arrangement.

The invention claimed is:

1. An illumination device to replace a standard light bulb and to provide a decorative illumination characteristic, comprising:
  a standard light bulb power connector equivalent to a power connector of the replaced light bulb, the power connector being adapted to fit into a standard light bulb power socket and having input power contacts for receiving an input power from a power source;
  at least one solid state light emitter;
  driving circuitry electrically connected to the power connector and compact enough to fit into a volume envelope of the replaced light bulb, and comprising a solid state circuit which regulates the input power from the power source to provide a regulated power to the at least one solid state light emitter; and
  a decorative illumination feature for producing a decorative illumination using light from at least one said solid state light emitter.

2. The device of claim 1, further comprising a circuit to respond to commands from a wireless remote control device.

3. The device of claim 1, further comprising a circuit to respond to the level of environmental, ambient illumination.

4. The device of claim 1, further comprising a circuit which includes a proximity sensor.

5. The device of claim 1, further comprising a circuit to communicate with other illumination devices.

6. The device of claim 1, further comprising a battery to provide continued operation if the input power fails.

7. The device of claim 1, further comprising a protective circuit preventing excessive current flow through the at least one solid state light emitter.

8. The device of claim 1, further comprising a protective circuit preventing heating of components beyond their maximum ratings.

9. The device of claim 8, in which the protective circuit comprises a component which is responsive to temperature and is disposed so to regulate the heat generation of the illumination device.

10. The device of claim 1, wherein the input power comprises direct-current source voltage.

11. The device of claim 1, wherein the input power comprises alternating-current source voltage.

12. The device of claim 1, further comprising a shade.

13. The device of claim 12, wherein the shade comprises a translucent material.

14. The device of claim 12, wherein the shade contains penetrations.

15. The device of claim 12, wherein the decorative illumination feature directs light from at least one said solid state light emitter onto the shade.

16. The device of claim 15, wherein the decorative illumination feature includes at least one solid state light emitter with an orientation different from an orientation of a solid state light emitter providing general, non-decorative illumination.

17. The device of claim 15, wherein the decorative illumination feature includes at least one solid state light emitter with a color spectrum different from a color spectrum of a solid state light emitter providing general, non-decorative illumination.

18. The device of claim 1, wherein at least one said solid state light emitter emits at least one color of light other than white.

19. The device of claim 1, wherein at least one said solid state light emitter is a light emitting diode.

20. The device of claim 1, wherein the at least one solid state light emitter comprises a group of densely packed light emitting semiconductor chips bonded to a common base.

21. The device of claim 20, wherein the common base is thermally conductive.

22. The device of claim 20, wherein the common base is reflective.

23. The device of claim 20, wherein the common base comprises a printed circuit board.

24. The device of claim 20, wherein the chips are electrically connected in series.

25. The device of claim 20, wherein the chips are electrically connected in parallel.

26. The device of claim 1, wherein the driving circuitry operates at a frequency above 1000 Hertz.

27. The device of claim 1, wherein the driving circuitry provides substantially constant current through each solid state light emitter.

28. The device of claim 1, wherein the driving circuitry provides substantially constant voltage for each solid state light emitter.

29. The device of claim 1, wherein the input power includes a source voltage that is greater than or equal to a voltage required for the at least one solid state light emitter.

30. The device of claim 1, wherein the input power includes a source voltage that is less than or equal to that required for the at least one solid state light emitter.

31. The device of claim 1, wherein the input power includes a source voltage that varies from a voltage above that required for the at least one solid state light emitter to a voltage below that required for the at least one solid state light emitter.

32. The device of claim 1, wherein the decorative illumination feature comprises control circuitry to control illumination characteristics.

33. The device of claim 32, wherein the illumination characteristics include color.

34. The device of claim 32, wherein the illumination characteristics include intensity.

35. The device of claim 32, wherein the illumination characteristics include a rate of flashing.

36. The device of claim 32, wherein the illumination characteristics include patterns of light.

37. The device of claim 32, wherein the control circuitry controls characteristics of the general illumination of the device.

38. The device of claim 32, wherein the control circuitry controls characteristics of the decorative illumination of the device.

39. The device of claim 32, wherein the illumination characteristics are for functional purposes.

40. The device of claim 32, wherein the illumination characteristics are for decorative purposes.

41. The device of claim 32, wherein the control circuitry varies the illumination characteristics over time.

42. The device of claim 32, wherein the control circuitry changes the illumination characteristics in response to interruptions of the input power within a predetermined time interval.

43. The device of claim 1, wherein the decorative illumination feature comprises switches allowing mechanical control of illumination characteristics.

44. The device of claim 1, wherein the decorative illumination feature comprises a mechanical actuator that alters a pattern and color of the illumination.

45. The device of claim 1, wherein the decorative illumination feature comprises (i) a mirror, and (ii) a motor that changes a position of the mirror.

46. The device of claim 1, wherein the decorative illumination feature comprises a mask creating a predetermined pattern of shapes and colors from light from the at least one solid state light emitter.

47. The device of claim 1, wherein the decorative illumination feature comprises a multi-faceted mirror.

48. The device of claim 1, wherein the decorative illumination feature comprises a diffractive optical component.

49. The device of claim 1, wherein the decorative illumination feature comprises circuitry to pulse the light.

\* \* \* \* \*